(12) United States Patent
Kojima

(10) Patent No.: US 8,014,158 B2
(45) Date of Patent: Sep. 6, 2011

(54) ELECTRONIC CONTROL APPARATUS

(75) Inventor: Akiyoshi Kojima, Kariya (JP)

(73) Assignee: DENSO CORPORATION, Kariya (JP)

( * ) Notice: Subject to any disclaimer, the term of this patent is extended or adjusted under 35 U.S.C. 154(b) by 328 days.

(21) Appl. No.: 12/292,232

(22) Filed: Nov. 14, 2008

(65) Prior Publication Data

US 2009/0129035 A1 May 21, 2009

(30) Foreign Application Priority Data

Nov. 15, 2007 (JP) ................................. 2007-297136

(51) Int. Cl.
*H05K 5/06* (2006.01)
(52) U.S. Cl. ..... 361/752; 174/520; 174/50.5; 174/50.52
(58) Field of Classification Search .................. 361/752; 174/520, 521, 50.5, 50.51, 50.52
See application file for complete search history.

(56) References Cited

U.S. PATENT DOCUMENTS

| | | | | |
|---|---|---|---|---|
| 5,060,113 | A * | 10/1991 | Jacobs | 361/721 |
| 6,034,876 | A * | 3/2000 | Ohno et al. | 361/752 |
| 6,407,925 | B1 | 6/2002 | Kobayashi et al. | |
| 6,573,448 | B2 * | 6/2003 | Mayer et al. | 174/481 |
| 6,628,523 | B2 * | 9/2003 | Kobayashi et al. | 361/736 |
| 6,707,678 | B2 | 3/2004 | Kobayashi et al. | |
| 6,717,051 | B2 * | 4/2004 | Kobayashi et al. | 174/535 |
| 6,927,337 | B2 * | 8/2005 | Kobayashi et al. | 174/535 |
| 7,144,275 | B2 | 12/2006 | Iida | |
| 7,413,445 | B2 * | 8/2008 | Inagaki et al. | 439/76.1 |
| 7,744,381 | B2 * | 6/2010 | Honda | 439/79 |
| 2003/0025393 | A1 | 2/2003 | Mayer et al. | |
| 2007/0109730 | A1 * | 5/2007 | Shigyo et al. | 361/600 |
| 2008/0045061 | A1 | 2/2008 | Hayashi | |
| 2009/0068862 | A1 | 3/2009 | Honda | |

FOREIGN PATENT DOCUMENTS

| | | |
|---|---|---|
| EP | 0 861 019 | 8/1998 |
| JP | 2003-258451 A | 9/2003 |
| JP | A-2003-258454 | 9/2003 |
| WO | WO 2007/132993 | 11/2007 |

OTHER PUBLICATIONS

Office Action mailed Sep. 15, 2009 from the Japan Patent Office in corresponding patent application No. 2007-297136 (and English translation).
Office Communication dated May 18, 2010 issued from the European Patent Office in a corresponding EP application No. 08 019 771.8-1242.
The Extended Search Report dated Apr. 9, 2009 from Europe Patent Office in a corresponding EP application No. 08019771.8.

* cited by examiner

*Primary Examiner* — Dameon E Levi
(74) *Attorney, Agent, or Firm* — Posz Law Group, PLC

(57) ABSTRACT

In an electronic control apparatus, a connector mounted on a circuit board accommodated in a casing body constructed with top and bottom casings is partially exposed outside the casing body to be mated with an external connector. A sealant is interposed between the top and bottom casings, between the top casing and the connector, and between the bottom casing and the connector. A sealing part of at least one of the top and bottom casings has a substantially rectangular ring shape with rounded four corners. A sealing part of the connector faces two adjacent corners of the rectangular sealing part and one side of the rectangular sealing part directly connecting the two adjacent corners.

11 Claims, 8 Drawing Sheets

ELECTRONIC CONTROL APPARATUS

CROSS REFERENCE TO RELATED APPLICATION

This application is based on and incorporates herein by reference Japanese Patent Application No. 2007-297136 filed on Nov. 15, 2007.

FIELD OF THE INVENTION

The present invention relates to an electronic control apparatus having a casing, a circuit board accommodated in a water-sealed inner space of the casing, and a connector mounted on the circuit board and partially exposed outside the casing.

BACKGROUND OF THE INVENTION

A waterproof electronic control apparatus has been proposed, for example, in U.S. Pat. No. 6,707,678 corresponding to JP 2001-85858. In an electronic control apparatus proposed in U.S. Pat. No. 6,707,678, a circuit board and a connector mounted on the circuit board are accommodated in an inner space of a casing. The casing is sealed by a sealing material so that the inner space of the casing can be water-sealed.

Specifically, the electronic control apparatus includes a casing having a top opening in its upper face portion for accommodating the circuit board and a cover for covering the opening of the casing. A side wall of the casing has a connector opening joined to the top opening. The opening of the casing is covered with the cover. Thus, the circuit board is accommodated in the casing such that the connector mounted on the circuit board is partially exposed outside the casing through the connector opening. The sealing material is applied between a top opening edge of the casing and an outer edge of the cover, between an outer surface of the connector and the outer edge of the cover, and between a connector opening edge of the casing and the outer surface of the connector.

In such a waterproof electronic control apparatus, a sealing material is applied to either an edge of a casing or an edge of a cover at a constant speed to improve productivity (i.e., manufacturing efficiency) of the electronic control apparatus. The edge, to which the sealing material is applied, has a substantially rectangular ring shape with corners to follow the outer shape of the circuit board. If at least one of the corners forms a right angle, it is difficult to uniformly apply the sealing material to the ring-shaped edge at the constant speed. The speed needs to be changed between a straight portion and a corner portion of the ring-shaped edge. As a result, the productivity of the electronic control apparatus is reduced.

In the electronic control apparatus proposed in U.S. Pat. No. 6,707,678, the corners of the ring-shaped edge are rounded. In such an approach, the sealing material can be uniformly applied to the ring-shaped edge at the constant speed to prevent a reduction in productivity.

However, in the electronic control apparatus proposed in U.S. Pat. No. 6,707,678, a seal between the casing and the connector is formed using a middle portion of one side of the ring-shaped edge of the casing. Therefore, the size of the casing in a longitudinal direction of the connector depends on the sum of the longitudinal length of the connector, the length of end portions of the one side of the ring-shaped edge, and the size of adjacent two corners directly joined through the one side. For this reason, it is difficult to reduce the size of the casing and accordingly the size of the electronic control apparatus.

SUMMARY OF THE INVENTION

In view of the above, it is an object of the present invention to provide an electronic control apparatus having a reduced size in a longitudinal direction of a connector mounted on a circuit board accommodated in a casing.

According to an aspect of the present invention, an electronic control apparatus includes a substantially rectangular circuit board, a connector, a casing body, and a sealant. The circuit board has first and second sides opposite to each other. The connector is mounted on the first side of the circuit board. The connector includes a connector housing and connector terminals supported by the connector housing. The connector housing has a connector sealing part on its outer surface and includes a mating portion to be mated with an external connector. At least one of the connector terminals has a first end electrically connected to the circuit board and a second end electrically connected to the external connector. The casing body has an inner space for accommodating the circuit board and a connector opening for receiving the connector housing in such a manner that the mating portion of the connector housing is located outside the casing body. The casing body includes a top casing located to face the first side of the circuit board. The top casing has a top sealing part on its edge portion. The casing body further includes a bottom casing located to face the second side of the circuit board. The bottom casing has a bottom sealing part on its edge portion. The top and bottom casings are assembled into the casing body in such a manner that the top sealing part faces the bottom sealing part and a top portion of the connector sealing part, and that the bottom sealing part faces the top sealing part and a bottom portion of the connector sealing part. The sealant includes a first portion interposed between the top sealing part and the bottom sealing part to form a casing seal, a second portion interposed between the top sealing part and the top portion of the connector sealing part to form a connector top seal, and a third portion interposed between the bottom portion of the connector sealing part and the bottom sealing part to form a connector bottom seal.

The casing seal, the connector top seal, and the connector bottom seal are joined together to cause the inner space of the casing body to be water-sealed. At least one of the top and bottom sealing parts has a substantially rectangular ring shape with rounded four corners. When the top sealing part has the rectangular ring shape, the top portion of the connector sealing part faces two adjacent corners of the top sealing part and one side of the top sealing part, the one side directly connecting the two adjacent corners. When the bottom sealing part has the rectangular ring shape, the bottom portion of the connector sealing part faces two adjacent corners of the bottom sealing part and one side of the bottom sealing part, the one side directly connecting the two adjacent corners.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENT

An electronic control apparatus 10 according to an embodiment of the present invention is described below with reference to FIGS. 1-18. The electronic control apparatus 10 has a waterproof structure. Therefore, for example, the electronic control apparatus 10 can be suitably applied to a vehicle engine electronic control unit (ECU) installed in a vehicle engine room, which can be exposed to water (moisture).

Figure 1:
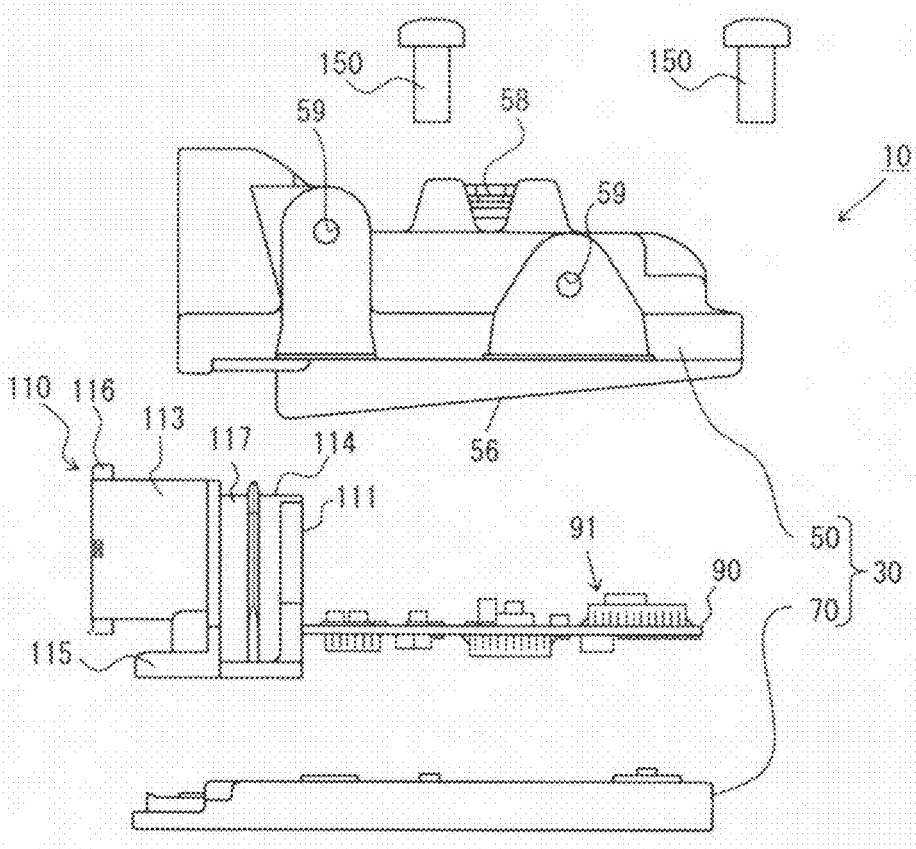
FIG. 1 is a diagram illustrating an exploded view of an electronic control apparatus according to an embodiment of the present invention.
Figure 2:
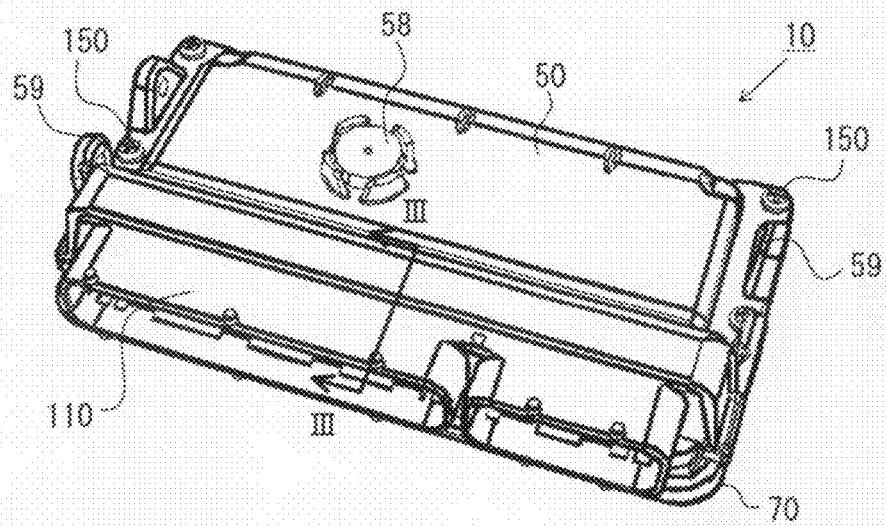
FIG. 2 is a diagram illustrating a perspective view of the electronic control apparatus.
Figure 3:
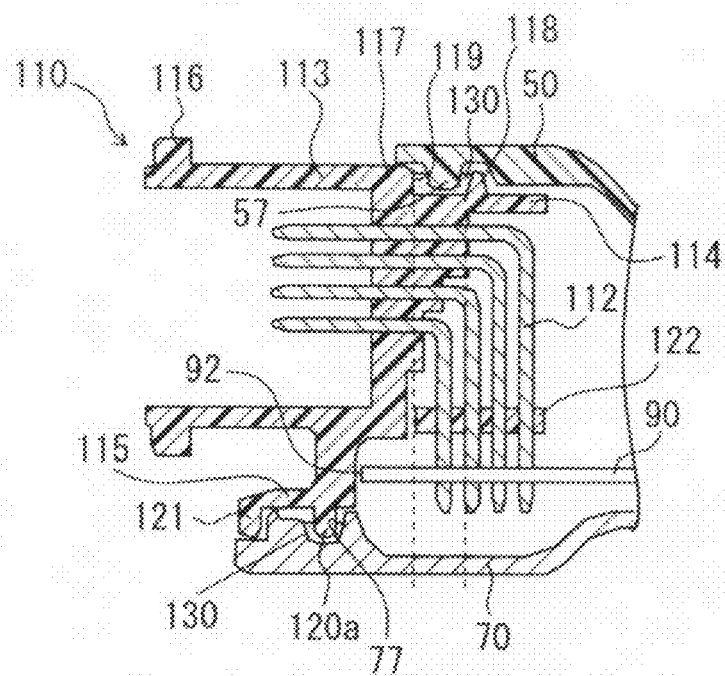
FIG. 3 is a diagram illustrating a cross-sectional view taken along line III-III of FIG. 2.

As shown in FIGS. 1-3, the electronic control apparatus 10 mainly includes a casing body 30 for defining an inner space, a circuit board 90 accommodated in the inner space of the casing body 30, a connector 110 mounted to a top side of the circuit board 90, and a sealing material (i.e., sealant) 130 for preventing water from entering the inner space of the casing body 30. The connector 110 is partially exposed outside the casing body 30 to be connected to (i.e., mated with) an external connector. In the embodiment, the circuit board 90 has a substantially rectangular shape.

Figure 4:
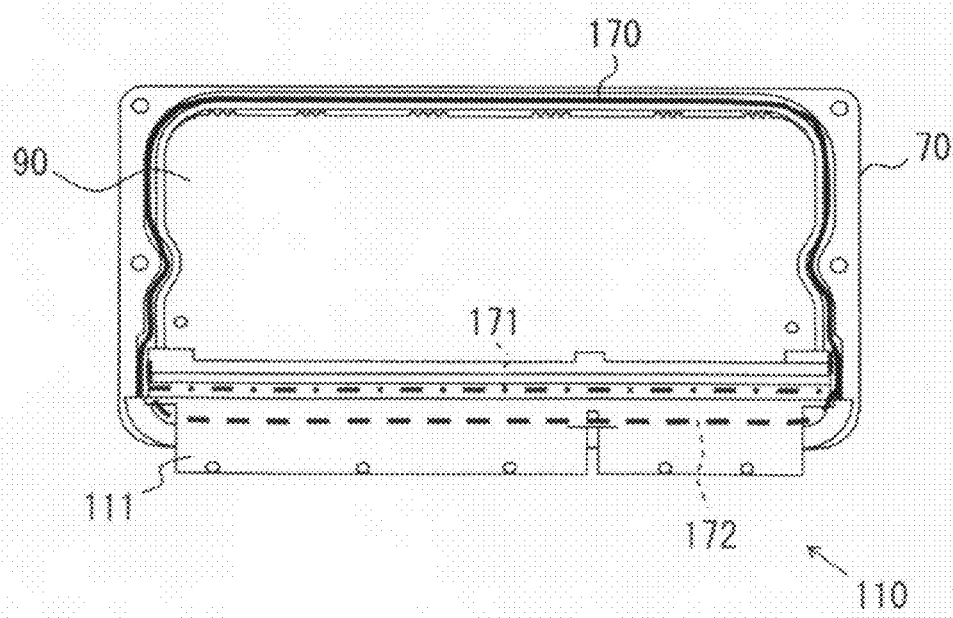
FIG. 4 is a diagram illustrating seals of the electronic control apparatus.

As shown in FIG. 1, the casing body 30 is divided in a thickness direction of the circuit board 90 into two parts, one of which is a top casing 50, and the other of which is a bottom casing 70. The top casing 50 is located to face the top side of the circuit board 90, and the bottom casing 70 is located to face a bottom side, opposite to the top side, of the circuit board 90. As shown in FIGS. 3 and 4, the sealing material 130 is applied between the top and bottom casings 50, 70 to form a casing seal 170 indicated by a heavy solid line of FIG. 4.

Further, the sealing material 130 is applied to an interface between the top casing 50 and a housing 111 of the connector 110 to form a connector top seal 171 indicated by a dot-dash-line of FIG. 4. Furthermore, the sealing material 130 is applied between the bottom casing 70 and the connector housing 111 to form a connector bottom seal 172 indicated by a broken line of FIG. 4. The connector top seal 171 and the connector bottom seal 172 are located at different positions in a surface direction of the circuit board 90. The casing seal 170, the connector top seal 171, and the connector bottom seal 172 are joined together at each longitudinal end of the connector housing 111 to form a three-way joint so that the inner space of the casing body 30 can be water-sealed. In the embodiment, as shown in FIG. 4, the casing seal 170 and the connector bottom seal 172 are arranged side by side over a predetermined length to overlap each other in a longitudinal direction of the connector housing 111.

Figure 5:
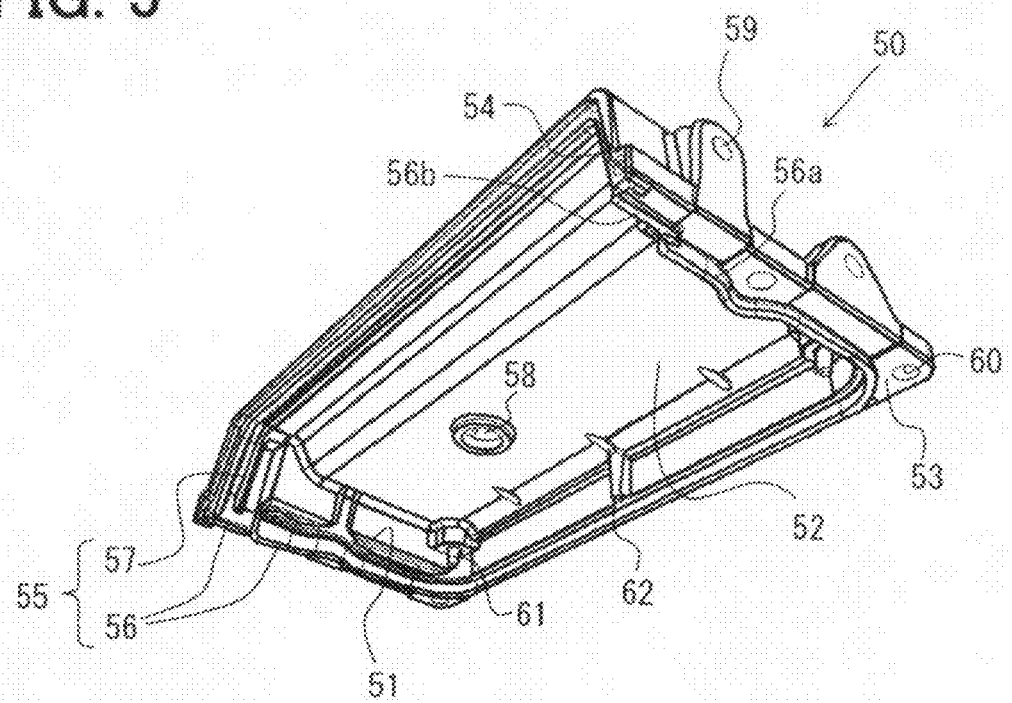
FIG. 5 is a diagram illustrating a bottom view of a top casing of a casing body of the electronic control apparatus.

The top casing 50 is formed by pressing, aluminum die-casting, plastic molding, or the like. The top casing 50 includes a top wall 52 having a substantially rectangular shape to suit the outer shape of the circuit board 90. The top casing 50 further includes a side wall joined to three sides of the top wall 52. Thus, the top casing 50 is shaped like a dustpan and has a bottom opening and a side opening. The bottom opening of the top casing 50 is used as the inner space of the casing body 30. The side opening of the top casing 50 is used as a connector opening, though which the connector 110 mounted on the circuit board 90 accommodated in the inner space of the casing body 30 is partially exposed outside the casing body 30. A bottom opening edge 51 of the top casing 50 has a substantially U-shape, and a connector opening edge 54 of the top casing 50 has a substantially trapezoid shape. A flange 53 is formed to an outer surface of the side wall of the top casing 50 and extends along the bottom opening edge 51. Thus, like the bottom opening edge 51, the flange 53 has a substantially U-shape. The flange 53 and the connector opening edge 54 are jointed together to provide an outer edge of the top casing 50. As shown in FIG. 5, a top sealing part 55, to which the sealing material 130 is applied, is formed along the outer edge of the top casing 50 to surround the top wall 52.

In the embodiment, the top sealing part 55 of the top casing 50 is configured as a projection. The top sealing part 55 has a casing sealing projection 56. The casing sealing projection 56 is formed in the flange 53 and extends from one longitudinal end of the flange 53 to the other longitudinal end of the flange 53. The casing sealing projection 56 projects with respect to the flange 53.

The casing sealing projection 56 includes a first projection 56a and a pair of second projections 56b. The first projection 56a extends along the flange 53 and has a substantially U-shape with two rounded corners. Each second projection 56b has a substantially straight shape with a predetermined length. Each second projection 56b has a width substantially equal to a width of the first projection 56a. The pair of second projections 56b are joined to opposite longitudinal ends of the first projection 56a to face each other. As can be seen from FIG. 5, each second projection 56b has a height, measured from a surface of the flange 53, less than that of the first projection 56a. Further, the facing distance between the pair of the second projections 56b is greater than the facing distance between the opposite longitudinal ends of the first projection 56a.

As described in detail later, the casing sealing projection 56 forms the casing seal 170 in cooperation with a casing sealing recess 76 and a pair of common recesses 78 of a bottom sealing part 75 of the bottom casing 70. The second projection 56b of the casing sealing projection 56 and a bottom sealing projection 120 (i.e., second projection 120b) of the connector housing 111 are arranged side by side in each common recess 78 of the bottom casing 70. Thus, the casing seal 170 and the connector bottom seal 172 are arranged side by side as mentioned previously.

The top sealing part 55 of the top casing 50 further has a top sealing projection 57. The top sealing projection 57 is formed along the connector opening edge 54 and projects with respect to the connector opening edge 54.

As described in detail later, the top sealing projection 57 forms the connector top seal 171 in cooperation with a top sealing recess 119 of the connector housing 111. The top sealing projection 57 extends from near one longitudinal end of the connector opening edge 54 to near the other longitudinal end of the connector opening edge 54 so that the connector top seal 171 can be joined to the casing seal 170 at one end and joined to the connector bottom seal 172 at the other end.

As shown in FIGS. 1, 2 and 5, the top casing 50 has a breathable filter 58 and a mounting bracket 59. The breathable filter 58 allows air flow between the inside and outside of the casing body 30. The mounting bracket 59 is used to mount the electronic control apparatus 10 to the vehicle. Further, as shown in FIG. 5, the top casing 50 has a screw hole 60, a locating projection 61, and a pressing projection 62. The top casing 50 and the bottom casing 70 are fixed together by inserting a screw 150, which is shown in FIGS. 1 and 2, into the screw hole 60. The circuit board 90 is positioned with respect to the top casing 50 using the locating projection 61. The circuit board 90 is pressed toward the bottom casing 70 by the pressing projection 62.

Figure 6:
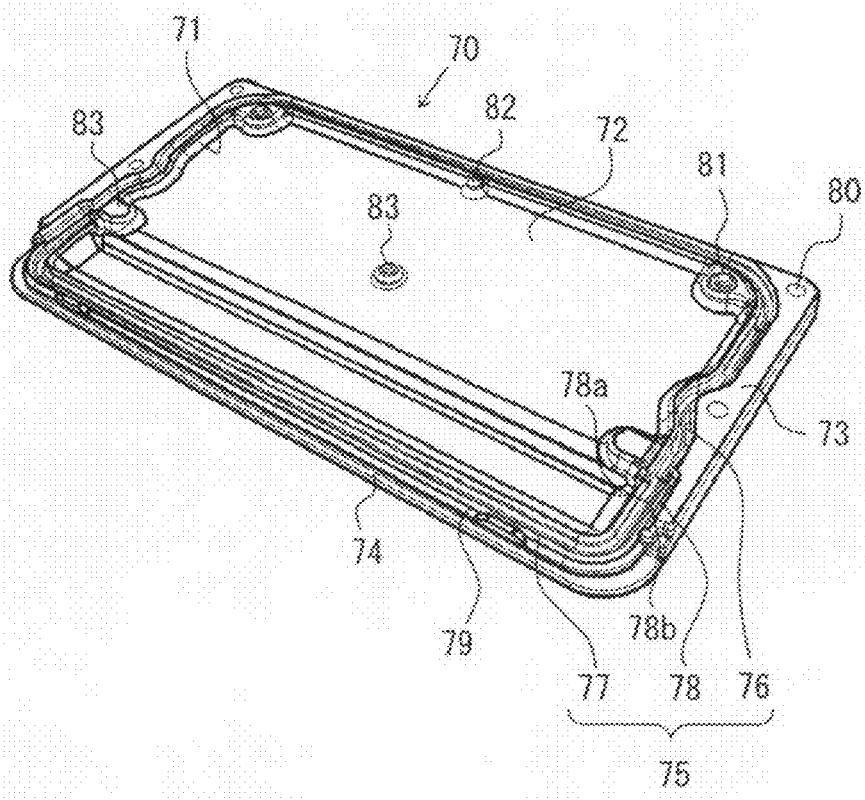
FIG. 6 is a diagram illustrating a top view of a bottom casing of the casing body.

The bottom casing 70 is formed by pressing, aluminum die-casting, plastic molding, or the like. As shown in FIG. 6, the bottom casing 70 includes a bottom wall 72 having a substantially rectangular shape to suit the outer shape of the circuit board 90. The bottom casing 70 further includes a low side wall joined to three sides of the bottom wall 72. Thus, the top casing 50 is shaped like a shallow box and has a top opening and a side opening. The top opening of the top casing 50 is used as the inner space of the casing body 30. The side opening of the bottom casing 70 is used as the connector opening. A top opening edge 71 of the bottom casing 70 has a substantially U-shape. A flange 73 is formed to an outer surface of the side wall of the bottom casing 70 and extends along the top opening edge 71. Thus, the flange 73 has a substantially U-shape. The flange 73 faces the flange 53 of the top casing 50. The flange 73 and a connector opening edge 74 are joined together to provide an outer edge of the bottom casing 70. In the embodiment, the connector opening edge 74 of the bottom casing 70 is located on a substantially common plane with the flange 73. The bottom sealing part 75, to which the sealing material 130 is applied, is formed along the outer edge of the bottom casing 70 to surround the bottom wall 72. The bottom sealing part 75 has a substantially rectangular ring shape with rounded four corners.

In the embodiment, the bottom sealing part 75 is configured as a recess. The bottom sealing part 75 has the casing sealing recess 76, the bottom sealing recess 77, and the pair of common recesses 78. The casing sealing recess 76 forms the casing seal 170 in cooperation with the casing sealing projection 56 of the top casing 50. The bottom sealing recess 77 forms the connector bottom seal 172 in cooperation with the bottom sealing projection 120 (i.e., first projection 120a) of the connector housing 111. The pair of common recesses 78 form the casing seal 170 and the connector bottom seal 172 in cooperation with the casing sealing projection 56 and the bottom sealing projection 120 (i.e., second projection 120b).

The casing sealing recess 76, the bottom sealing recess 77, and the pair of common recesses 78 are joined together such that the bottom sealing part 75 has the rectangular ring shape.

Figure 7:
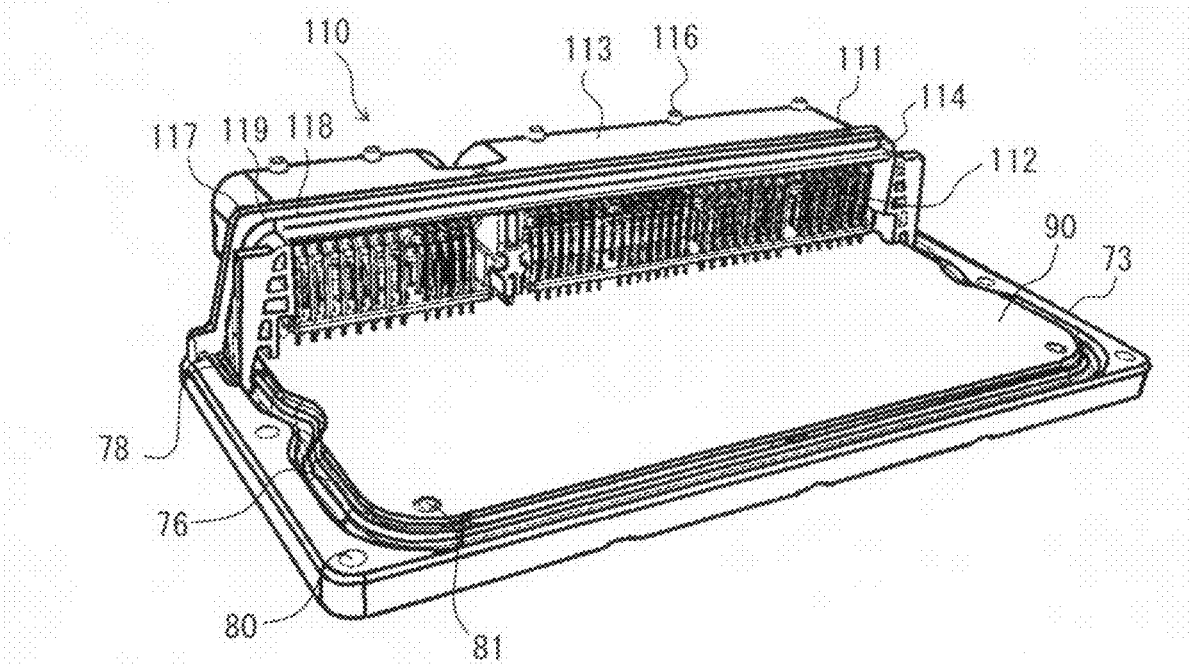
FIG. 7 is a diagram illustrating a perspective view of a connector mounted on a circuit board accommodated in the bottom casing.
Figure 8:
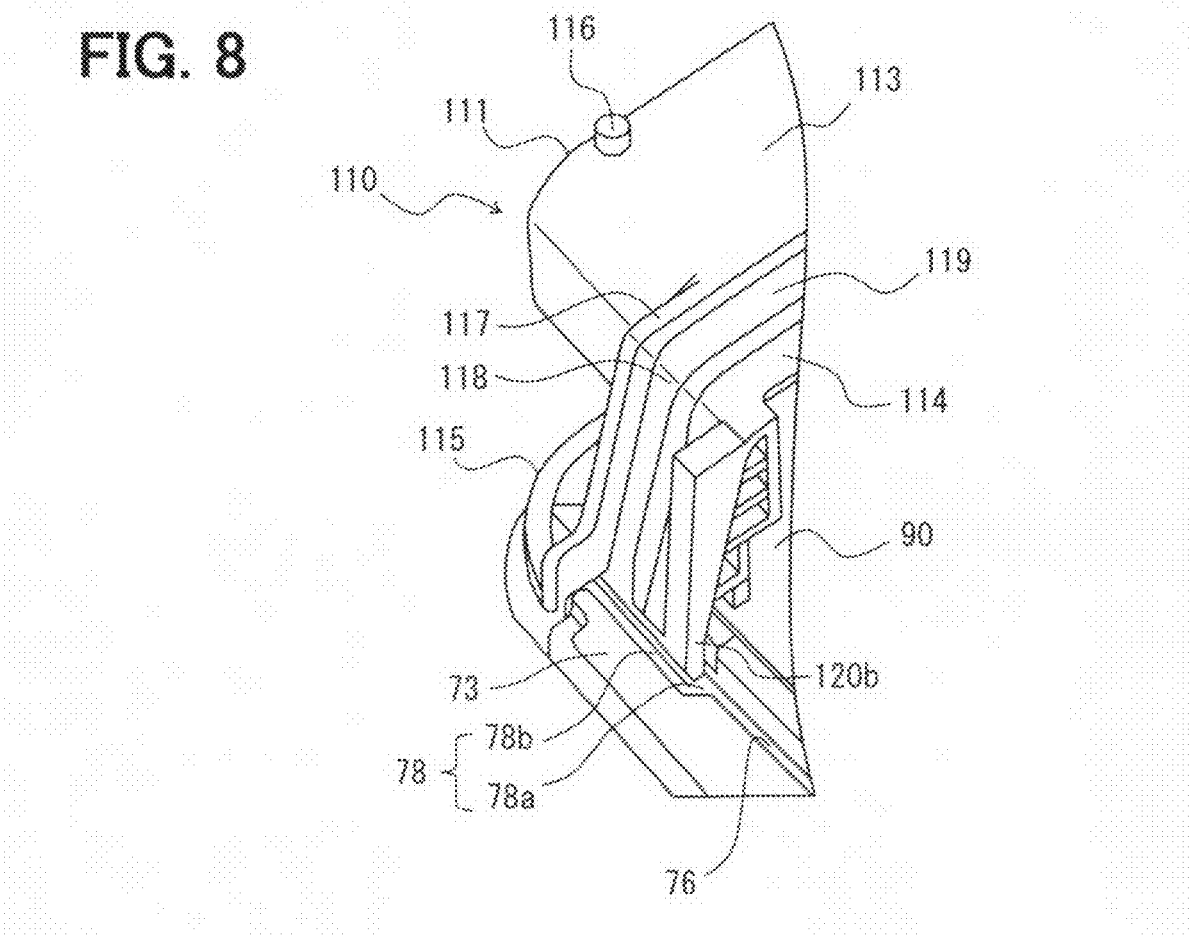
FIG. 8 is a diagram illustrating a partially enlarged view of FIG. 7.

Specifically, the casing sealing recess 76 of the bottom sealing part 75 forms the casing seal 170 in cooperation with the first projection 56a of the casing sealing projection 56. The casing sealing recess 76 is formed in the flange 73 and recessed with respect to the flange 73. The casing sealing recess 76 extends along the flange 73 and has a substantially U-shape with two rounded corners. The common recess 78 is formed at each longitudinal end of the casing sealing recess 76. The common recess 78 has a width greater than that of the casing sealing recess 76. One end of the common recess 78 is joined to one end of the casing sealing recess 76. The other end of the casing sealing recess 76 is elongated to the longitudinal end of the flange 73. In such an approach, the second projection 56b of the top casing 50 and the bottom sealing projection 120 (i.e., second projection 120b) can be arranged side by side in the common recess 78. As shown in FIGS. 6-8, the common recess 78 has inner and outer portions 78a, 78b having different depths (i.e., heights). Specifically, the outer portion 78b has a depth less than (i.e., height greater than) the inner portion 78a. The second projection 120b of the bottom sealing projection 120 is inserted in the inner portion 78a of the common recess 78. The second projection 56b of the casing sealing projection 56 is inserted in the outer portion 78b of the common recess 78.

The other ends of the pair of common recesses 78 are joined together through the bottom sealing recess 77. The bottom sealing recess 77 extends along the connector opening edge 74. The bottom sealing recess 77 provides two adjacent rounded corners of the rectangular-ring-shaped bottom sealing part 75 and one side of the rectangular-ring-shaped bottom sealing part 75 directly connecting the two adjacent rounded corners.

In the embodiment, the bottom casing 70 further has an outer projection 79. The outer projection 79 is formed outside the bottom sealing recess 77 and extends along the bottom sealing recess 77. The outer projection 79 connects the longitudinal ends of the flange 73 to surround the bottom sealing recess 77. As shown in FIG. 6, the bottom casing 70 has a screw hole 80, a locating projection 81, a pressing projection 82, and a supporting base 83. The screw 150 inserted through the screw hole 60 of the top casing 50 is screwed into the screw hole 80 of the bottom casing 70 so that the top and bottom casings 50, 70 can be fixed together. The circuit board 90 is positioned with respect to the bottom casing 70 using the locating projection 81. The circuit board 90 is pressed toward the top casing 50 by the pressing projection 82. Thus, the circuit board 90 is securely held between the pressing projection 62 of the top casing 50 and the pressing projection 82 of the bottom casing 70. The circuit board 90 is supported on the supporting base 83.

As shown in FIG. 1, electronic devices 91 are mounted on the circuit board 90 and electrically connected together through wiring traces and via holes formed in the circuit board 90. Examples of the electronic devices 91 can include a microcomputer, a power transistor, a resistor, and a capacitor. The connector 110 is also mounted on the circuit board 90 to electrically connect the circuit board 90 to an external circuit via the external connector. The circuit board 90 can be, for example, made of thermoplastic resin, thermosetting resin, ceramic, or a composition of glass (e.g., glass fabric) and resin. The circuit board 90 can be configured as a multilayer board.

In the embodiment, as shown in FIG. 3, one edge (i.e., one side) 92 of the circuit board 90 accommodated in the casing body 30 is located on the connector opening side. The edge 92 of the circuit board 90 is located closer to a mating portion 113 of the connector housing 111 than the connector top seal 171 in a mating direction of the connector 110. That is, the edge 92 of the circuit board 90 is located ahead of the connector top seal 171 in a direction from inside to outside of the casing body 30 via the connector opening. As mentioned previously, the connector top seal 171 is formed by applying the sealing material 130 between the top sealing projection 57 of the top casing 50 and the top sealing recess 119 of the connector housing 111.

The connector 110 includes the connector housing 111 and connector terminals 112. The connector housing 111 is made of an electrically insulating material such as resin. The connector terminals 112 are made of an electrically conducting material. The connector terminals 112 are supported in the connector housing 111 in such a manner that first and second ends of each connector terminal 112 can be exposed to opposite sides of the connector housing 111. As shown in FIG. 3, the first end of the connector terminal 112 is located inside the casing body 30 and electrically connected to the circuit board 90 through solder. In the embodiment, the first ends of the connector terminals 112 are spaced at regular intervals using an arrangement plate 122 having through holes.

The second end of the connector terminal 112 is located outside the casing body 30 to be connected to (mated with) the external connector. The size and the number of the connector terminals 112 can vary. In the embodiment, the connector 110 is mounted on the circuit board 90 by inserting the connector terminals 112 into holes of the circuit board 90. Alternately, the connector 110 can be surface-mounted on the circuit board 90.

As shown in FIGS. 1, 3, and 9-12, the connector housing 111 has the mating portion 113, a casing inside portion 114, and a bottom sealing extension 115. The mating portion 113 is located outside the casing body 30 and mated with the external connector. The casing inside portion 114 is located inside the casing body 30 and forms the connector top seal 171 in cooperation with the top casing 50. The bottom sealing extension 115 is elongated from the casing inside portion 114 and forms the connector bottom seal 172 in cooperation with the bottom casing 70.

Figure 12:
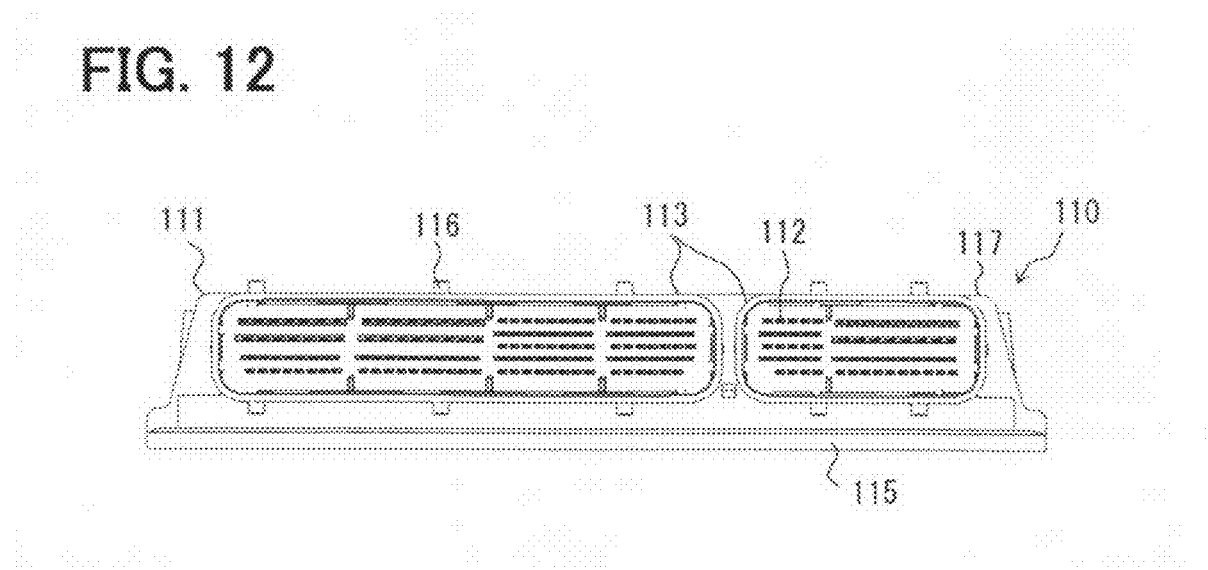
FIG. 12 is a diagram illustrating a front view of the connector.

Specifically, the mating portion 113 has one end joined to the casing inside portion 114 and the other end having a tube portion to be mated with the external connector. As shown in FIG. 12, the second end of the connector terminal 112 is located in the tube portion of the mating portion 113 so that the connector terminal 112 can be electrically connected to the external connector. A hock projection 116 is formed on an outer surface of the mating portion 113. The hock projection 116 is received by a hook receiver of the external connector so that the connector 110 and the external connector can be securely mated together. In the embodiment, as shown in FIG. 12, the mating portion 113 is divided to provide two ports so that two different external connectors can be mated with the connector 110. For example, the connector 110 can be mated with connectors of engine electrical system components.

Figure 9:
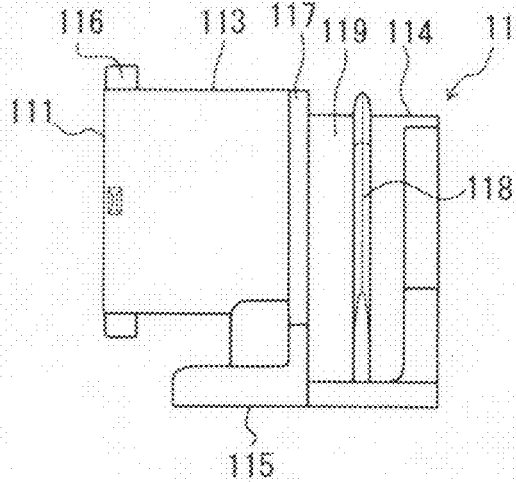
FIG. 9 is a diagram illustrating a side view of the connector.
Figure 10:
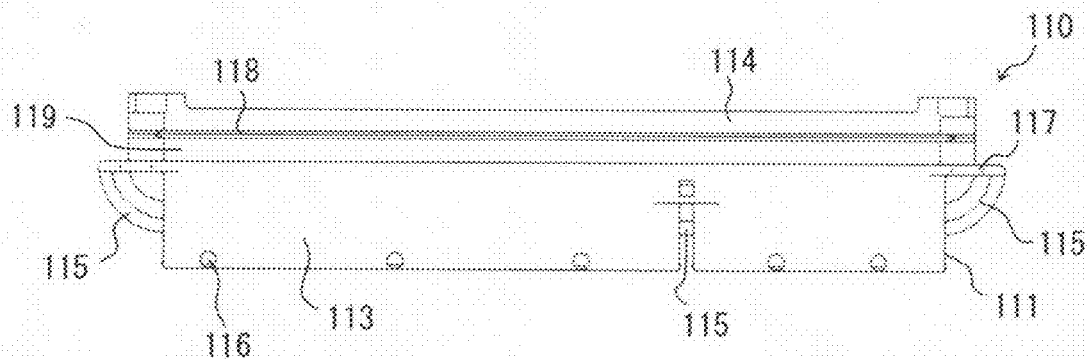
FIG. 10 is a diagram illustrating a top view of the connector.

An outer surface of the casing inside portion 114 forms a substantially trapezoid shape corresponding to the shape of the connector opening edge 54 of the top casing 50. As shown in FIGS. 9 and 10, a first projection 117 and a second projection 118 are formed on the outer surface of the casing inside portion 114. The first projection 117 is located at an interface with the mating portion 113. The second projection 118 is located away from the interface so that the top sealing recess 119 can be formed between the first and second projections 117, 118. As mentioned previously, the top sealing recess 119 forms the connector top seal 171 in cooperation with the top sealing projection 57 of the top casing 50. The top sealing recess 119 is formed on a top side and two opposite sides of the outer surface of the trapezoid-shaped casing inside portion 114. The first end of each connector terminal 112 extends from the casing inside portion 114 into the inner space of the casing body 30 and is electrically connected to the circuit board 90.

Figure 11:
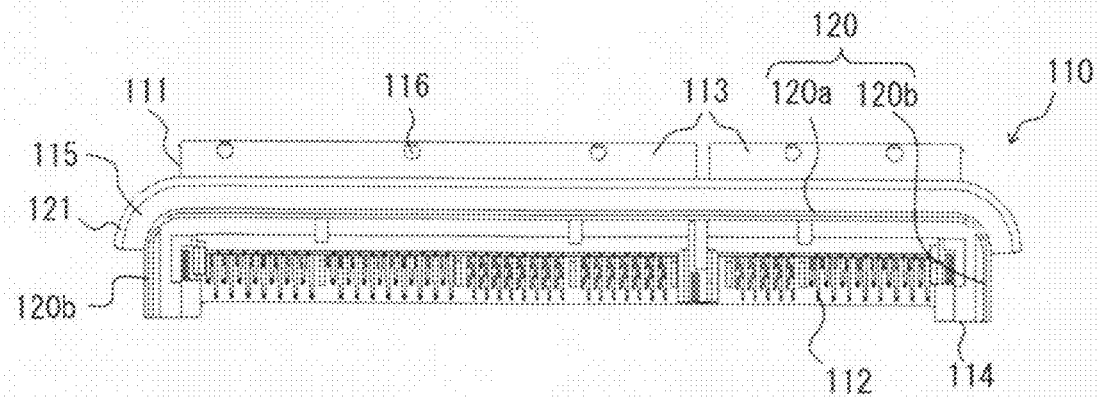
FIG. 11 is a diagram illustrating a bottom view of the connector.

The casing inside portion 114 is elongated toward the mating portion 113 to provide the bottom sealing extension 115. The bottom sealing extension 115 extends substantially parallel to the bottom casing 70. As shown in FIG. 11, the first projection 120a of the bottom sealing projection 120 is formed in the bottom sealing extension 115. The first projection 120a corresponds to (i.e., is received in) the bottom sealing recess 77 of the bottom casing 70. That is, the first projection 120a has two rounded corners and one side directly connecting the two rounded corners. In the embodiment, as shown in FIG. 11, the second projection 120b of the bottom sealing projection 120 is formed at a lower portion of each longitudinal end of the casing inside portion 114. The second projection 120b corresponds to (i.e., is received in) the inner portion 78a of the common recess 78. The second projection 120b is joined to each rounded corner of the first projection 120a so that the bottom sealing projection 120 can have the substantially U-shape with the two rounded corners.

Figure 13:
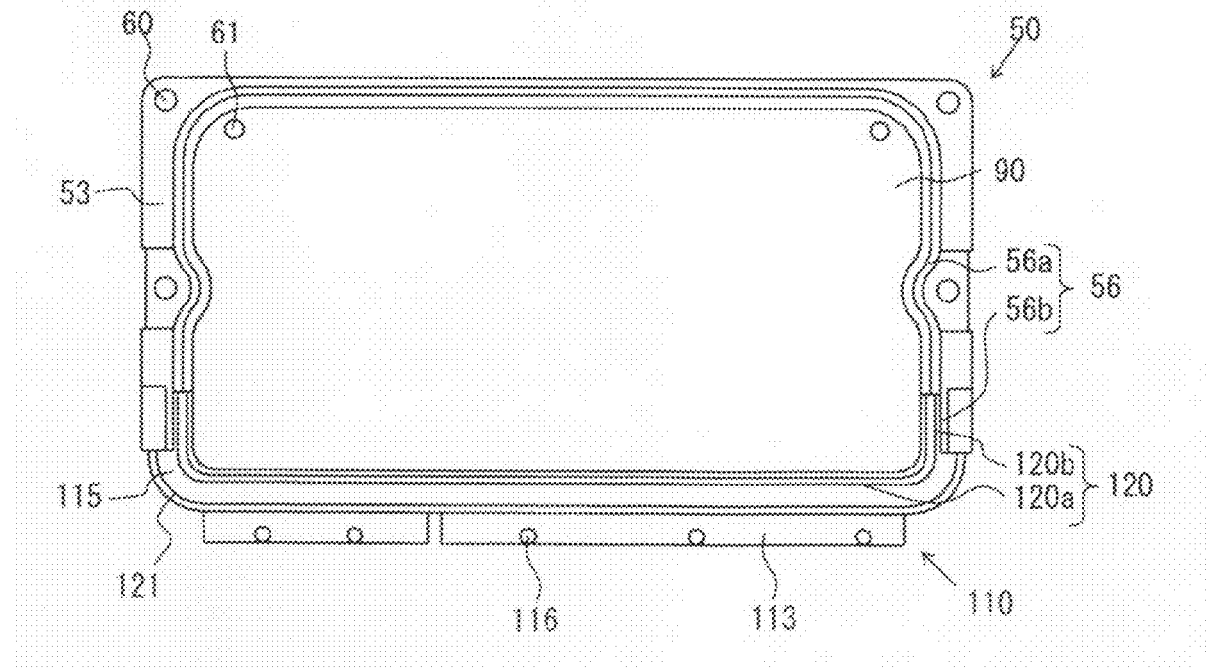
FIG. 13 is a diagram illustrating a top view of the top casing in which the connector mounted on the circuit board is accommodated.

Therefore, as shown in FIG. 13, when the top casing 50 and the connector 110 are assembled together, the second projection 56b of the casing sealing projection 56 and the second projection 120b of the bottom sealing projection 120 of the connector 110 are arranged side by side to overlap each other in the longitudinal direction of the connector housing 111. Further, the second projection 120b of the bottom sealing projection 120 of the connector 110 and the first projection 56a of the casing sealing projection 56 are substantially arranged in a line and joined together.

In the embodiment, as shown in FIG. 13, an outer projection 121 is formed on an outer edge of the bottom sealing extension 115 to surround the first projection 120a, which is formed on an inner edge of the bottom sealing extension 115. The outer projection 79 of the bottom casing 70 is inserted in a recess formed between the first projection 120a and the outer projection 121.

The sealing material 130 used to form the seals 170-172 can be made of a material that provides a sealing effect to cause the inner space of the casing body 30 to be water-sealed. For example, the sealing material 130 can be made of a material having an adhesivity that joins the top casing 50, the bottom casing 70, and the connector housing 111 together when the material is cured (i.e., hardened). For another example, the sealing material 130 can be made of a material having an elasticity that produces biasing force between the top casing 50, the bottom casing 70, and the connector housing 111. Alternatively, the sealing material 130 can be made of a material having both the adhesivity and the elasticity. In the embodiment, a moisture-curable silicon adhesive is used as the sealing material 130.

Figure 14:
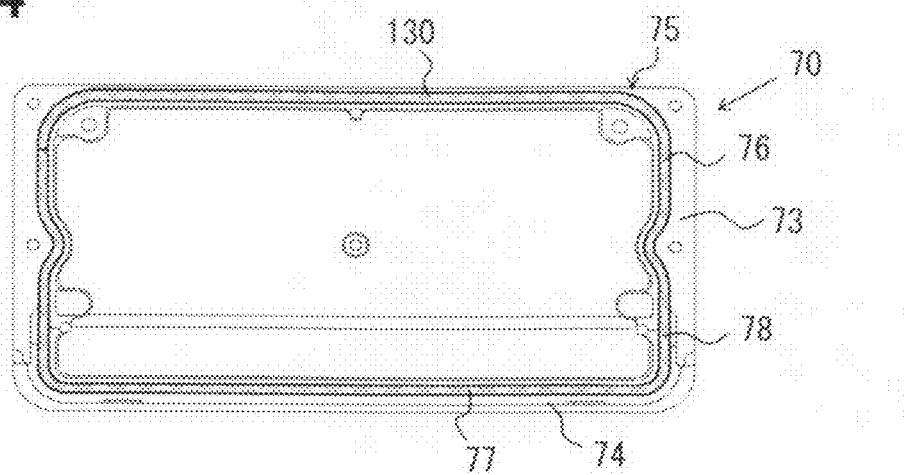
FIG. 14 is a diagram illustrating a first process of assembling the electronic control apparatus.

A process of assembling the electronic control apparatus 10 is described below with reference to FIGS. 14-16. Firstly, as shown in FIG. 14, the sealing material 130 is applied to the whole bottom sealing part 75 of the bottom casing 70 so that each of the casing sealing recess 76, the bottom sealing recess 77, and the common recess 78 can be filled with the sealing material 130. Thus, the sealing material 130 for forming the casing seal 170 is joined to the sealing material 130 for forming the connector bottom seal 172.

Figure 15:
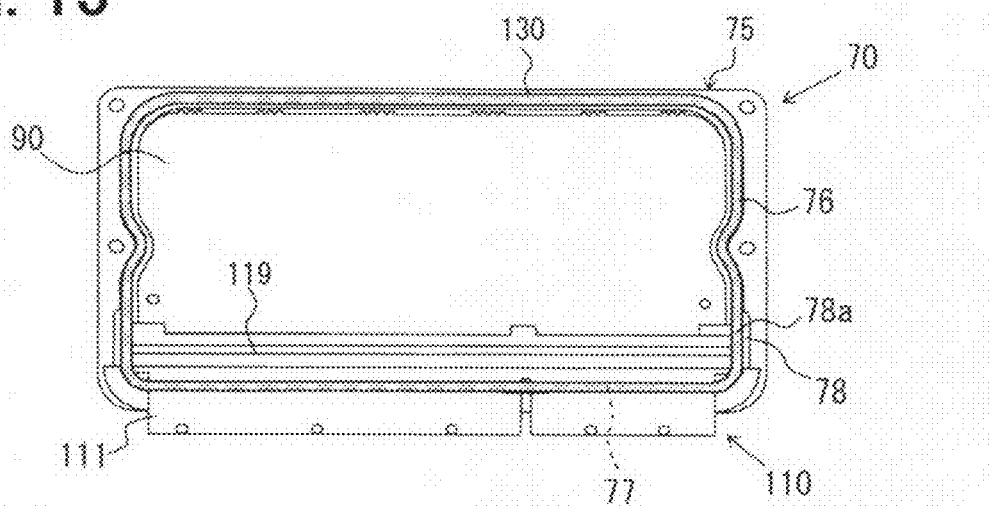
FIG. 15 is a diagram illustrating a second process of assembling the electronic control apparatus.

Next, as shown in FIG. 15, the circuit board 90, on which the electronic device 91 and the connector 110 are already mounted, is placed in the bottom casing 70 in such a manner than the bottom sealing projection 120 of the connector housing 111 is inserted in a corresponding recess of the bottom sealing part 75 and in contact with the sealing material 130. As a result, the first projection 120a of the bottom sealing projection 120 is inserted in the bottom sealing recess 77 and in contact with the sealing material 130, and the second projection 120b of the bottom sealing projection 120 is inserted in the inner portion 78a of the common recess 78 and in contact with the sealing material 130. Further, as shown in FIG. 15, the top sealing recess 119 of the connector housing 111 and the bottom sealing part 75 of the bottom casing 70 are joined together at each common recess 78 of the bottom sealing part 75.

Figure 16:
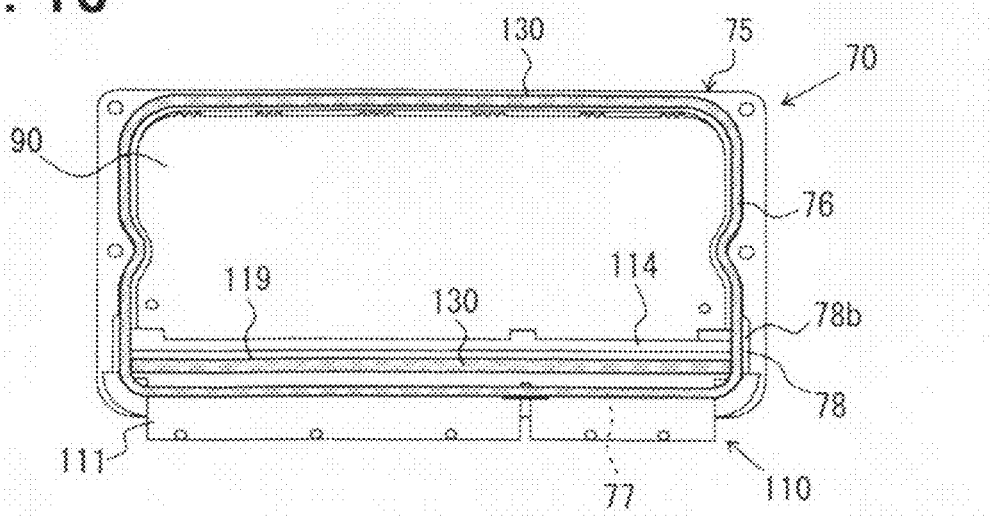
FIG. 16 is a diagram illustrating a third process of assembling the electronic control apparatus.

Then, as shown in FIG. 16, the sealing material 130 is applied to the top sealing recess 119. Thus, the sealing material 130 for forming the casing seal 170 is joined to the sealing material 130 for forming the connector top seal 171 and the sealing material 130 for forming the connector bottom seal 172 at each longitudinal end of the connector housing 111. Then, the top casing 50 is attached to the bottom casing 70 in such a manner that the first projection 56a of the casing sealing projection 56 is inserted in the casing sealing recess 76 and in contact with the sealing material 130, and that the second projection 56b of the casing sealing projection 56 is inserted in the outer portion 78b of the common recess 78 and in contact with the sealing material 130. Finally, the top and bottom casings 50, 70 are fixed together by inserting the screw 150 in the screw holes 60, 80. Thus, the assembly of the electronic control apparatus 10 is completed.

In the assembled electronic control apparatus 10, the casing sealing projection 56 on the flange 53 of the top casing 50 is inserted in the casing sealing recess 76 and the common recess 78 (i.e., outer portion 78b). The casing sealing projection 56 is buried in the sealing material 130 in the casing sealing recess 76 and the common recess 78 (i.e., outer portion 78b). Thus, the casing seal 170 shown in FIG. 4 is formed by the casing sealing projection 56, the casing sealing recess 76, the common recess 78, and the sealing material 130 interposed therebetween. Further, the top sealing projection 57 on the connector opening edge 54 of the top casing 50 is inserted in the top sealing recess 119 of the connector housing 111. The top sealing projection 57 is buried in the sealing material 130 in the top sealing recess 119. Thus, the connector top seal 171 shown in FIG. 4 is formed by the top sealing projection 57, the top sealing recess 119, and the sealing material 130 interposed therebetween. Furthermore, the bottom sealing projection 120 (i.e., first projection 120a) of the connector housing 111 is inserted in the bottom sealing recess 77 on the connector opening edge 74 of the bottom casing 70. The bottom sealing projection 120 is buried in the sealing material 130 in the bottom sealing recess 77. Thus, the connector bottom seal 172 shown in FIG. 4 is formed by the bottom sealing projection 120, the bottom sealing recess 77, and the sealing material 130 interposed therebetween. In this way, the inner space of the casing body 30 is water-sealed by the seals 170-172. Further, in the embodiment, the bottom sealing projection 120 (i.e., second projection 120b) of the connector housing 111 is inserted in the common recess 78 on the flange 73 of the bottom casing 70. As a result, the connector bottom seal 172 is elongated beyond a joint with the connector top seal 171 in a direction opposite to the connector 110 side. Thus, the casing seal 170 and the connector bottom seal 172 are arranged side by side over a predetermined length to overlap each other in the longitudinal direction of the connector housing 111.

According to the embodiment, as shown in FIG. 14, since the bottom sealing part 75 of the bottom casing 70 has the rectangular ring shape, the sealing material 130 can be seamlessly, uniformly applied to the bottom sealing part 75 at a constant speed without changing the speed between at a straight portion (i.e., side) of the bottom sealing part 75 and at a corner portion of the bottom sealing part 75. Therefore, quality and productivity of the electronic control apparatus 10 can be improved. Further, since the bottom sealing part 75 is configured as a recess, the sealing material 130 applied to the bottom sealing part 75 can surely remain in the bottom sealing part 75.

Figure 17:
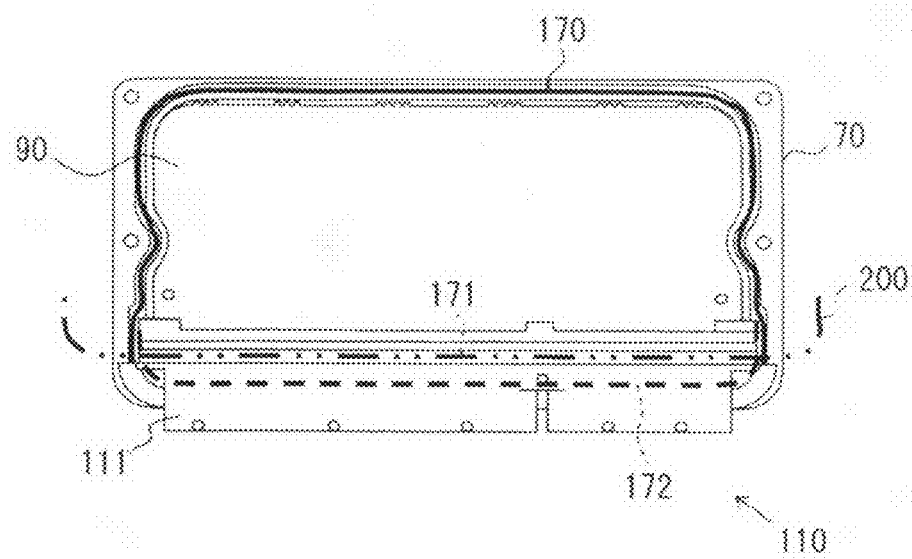
FIG. 17 is a diagram illustrating seals of the electronic control apparatus and a prior-art.

According to the embodiment, the bottom sealing projection 120 (i.e., the first projection 120a) of the connector housing 111 is shaped to follow the bottom sealing recess 77, which provides two adjacent rounded corners of the rectangular-ring-shaped bottom sealing part 75 and one side of the bottom sealing part 75 directly connecting the two adjacent rounded corners. That is, the bottom sealing projection 120 of the connector housing 111 has a substantially U-shape corresponding to the one side and the two adjacent corners of the bottom sealing part 75 of the bottom casing 70. Therefore, as shown in FIG. 17, the connector bottom seal 172 seals two adjacent corners of the bottom casing 70 and one side of the bottom casing 70 directly connecting the two adjacent corners. In such an approach, the length of the bottom casing 70 can be almost equal to the length of the connector 110. The size of the electronic control apparatus 10 in the longitudinal direction of the connector 110 can be reduced accordingly.

According to the embodiment, the bottom sealing part 75 of the bottom casing 70 has the rectangular ring shape. The connector housing 111 has the top sealing recess 119, which faces the top sealing part 55 of the top casing 50 to form the connector top seal 171. The connector housing 111 further has the bottom sealing projection 120, which faces the bottom sealing part 75 to form the connector bottom seal 172. The first projection 120a of the bottom sealing projection 120 is located closer to the mating portion 113 of the connector housing 111 than the top sealing recess 119 in the mating direction of the connector 110. That is, the first projection 120a is located ahead of the top sealing recess 119 in the direction from inside to outside of the casing body 30 via the connector opening. The casing seal 170, the connector top seal 171, and the connector bottom seal 172 are joined together at each longitudinal end of the connector housing 111 to form the three-way joint like the T-shaped joint.

In such an approach, the size of the connector 110 in the thickness direction of the circuit board 90 can be increased while reducing the size of the electronic control apparatus 10 in the mating direction. Accordingly, the number of the connector terminals 112 can be increased so that the connector terminals 112 can be arranged in a multistage manner. Alternatively, the size of the electronic control apparatus 10 in the thickness direction of the circuit board 90 can be reduced by keeping the width of the connector 110 in the thickness direction of the circuit board 90 unchanged.

As described above, according to the embodiment, the bottom sealing part 75 of the bottom casing 70 has the rectangular ring shape. Alternatively, instead of the bottom sealing part 75, the top sealing part 55 can have the rectangular ring shape. In this case, the top sealing recess 119 is located closer to the mating portion 113 of the connector housing 111 than the first projection 120a of the bottom sealing projection 120 in the mating direction of the connector 110.

Both the top sealing part 55 and the bottom sealing part 75 can have the rectangular ring shape. However, for the reasons described above, it is preferable that one of the top sealing part 55 and the bottom sealing part 75 should have the rectangular ring shape. Further, when one of the top sealing part 55 and the bottom sealing part 75 has the rectangular ring shape, the connector top seal 171 or the connector bottom seal 172 extends straightly in the longitudinal direction of the connector housing 111. Thus, the amount of the sealing material 130 used for the connector top seal 171 or the connector bottom seal 172 can be reduced. The casing seal 170, the connector top seal 171, and the connector bottom seal 172 can be joined together to form a three-way joint other than a T-shaped joint. For example, the joint can have a Y-shape.

According to the embodiment, the bottom sealing part 75 of the bottom casing 70 has the rectangular ring shape. As shown in FIGS. 3 and 4, a distance between the connector bottom seal 172 and the mating portion 113 of the connector 110 is less than a distance between the connector top seal 171 and the mating portion 113 in the mating direction of the connector 110. That is, the connector bottom seal 172 is located ahead of the connector top seal 171 in the direction from inside to outside of the casing body 30 via the connector opening. In such an approach, a distance between the edge 92 of the circuit board 90 and the mating portion 113 can be equal to or less than the distance between the connector top seal 171 and the mating portion 113 in the mating direction. Accordingly, the size of the electronic control apparatus 10 in the mating direction can be reduced.

According to the embodiment, the casing seal 170, the connector top seal 171, and the connector bottom seal 172 are joined together to form the joint at each corner end of the bottom sealing recess 77. In such an approach, a distance between the connector top seal 171 and the connector bottom seal 172 in the mating direction is reduced to reduce warpage of the connector 110 in the thickness direction of the circuit board 90. Further, the size of the connector 110 in the mating direction can be reduced, and accordingly the size of the electronic control apparatus 10 in the mating direction can be reduced.

Figure 18:
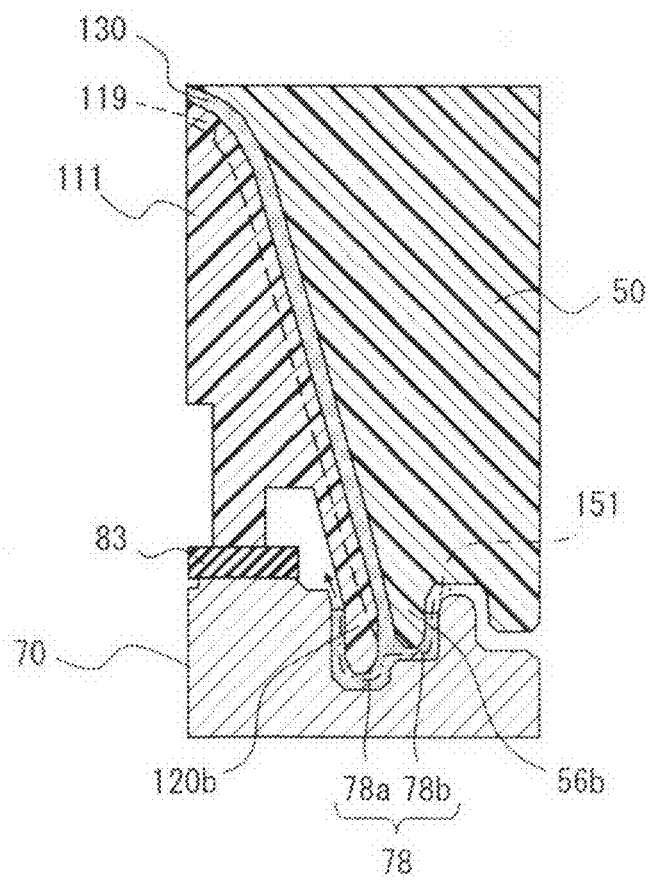
FIG. 18 is a diagram illustrating an enlarged cross-sectional view of a joint of the seals of the electronic control apparatus.

According to the embodiment, as clearly shown in FIG. 18, the second projection 56b of the casing sealing projection 56 and the second projection 120b of the bottom sealing projection 120 of the connector housing 111 are inserted in the common recess 78 and arranged side by side in the longitudinal direction of the connector housing 111. Thus, the casing seal 170 and the connector bottom seal 172 are arranged side by side over a predetermined length. In such an approach, even when manufacturing variations occur, it can be ensured that the inner space of the casing body 30 is water-sealed. Further, the length of a leak path 151 at the three-way joint can be increased. The leak path 151 is indicated by a dot-dash-line of FIG. 18 and represents a path through which water can enter the inner space of the casing body 30. Therefore, the inner space of the casing body 30 can be surely water-sealed.

According to the embodiment, as shown in FIGS. 6 and 8, the ring-shaped bottom sealing part 75 has a maximum width at the common recess 78. In such an approach, the leak path 151 is increased so that the inner space of the casing body 30 can be surely water-sealed.

According to the embodiment, as clearly shown in FIG. 18, the common recess 78 has inner and outer portions 78a, 78b having different depths. The second projection 120b is inserted in the inner portion 78a, and the second projection 56b is inserted in the outer portion 78b. In such an approach, the leak path 151 is increased so that the inner space of the casing body 30 can be surely water-sealed.

According to the embodiment, the top sealing part 55 of the top casing 50 is configured as a projection, and the bottom sealing part 75 of the bottom casing 70 is configured as a recess. The top sealing recess 119 of the connector 110 receives the projection of the top casing 50, and the bottom sealing projection 120 of the connector 110 is inserted in the recess of the bottom casing 70. In this way, the seals 170-172 are formed by the recess, the projection inserted in the recess, and the sealing material 130 interposed between the recess and the projection. In such an approach, the length of the leak path 151 can be efficiently increased. Further, even if air is trapped in the sealing material 130 in the recess, the air can be released to outside the recess when the projection is inserted in the recess. The amount of the sealing material 130 used for the seals 170-172 can be reduced accordingly. It is preferable that the tip of the projection inserted in the recess be rounded as shown in FIG. 18. In such an approach, the air can be efficiently released to outside the recess.

According to the embodiment, as shown in FIGS. 3 and 13, the outer projection 121 is formed on the outer edge of the bottom sealing extension 115 to surround the first projection 120a, which is formed on the inner edge of the bottom sealing extension 115. The outer projection 79 of the bottom casing 70 is inserted in the recess formed between the first projection 120a and the outer projection 121. That is, a combination of a projection and a recess is located outside the first projection 120a, which forms the connector bottom seal 172. In such an approach, even if the sealing material 130 applied to the first projection 120a is too much, the combination of the projection and the recess prevents the connector bottom seal 172 from being exposed outside the casing body 30. Further, the leak path is increased by the combination of the projection and the recess. Such a combination of a projection and a recess can be used to prevent the casing seal 170 and the connector top seal 171 from being exposed outside the casing body 30.

(Modifications)

The embodiment described above can be modified in various ways. For example, the top sealing part 55 of the top casing 50 can be configured as a recess, and the bottom sealing part 75 of the bottom casing 70 can be configured as a projection. In this case, the connector 110 can have a top sealing projection inserted in the recess of the top casing 50 and a bottom sealing recess for receiving the projection of the bottom casing 70.

In the embodiment, the seals 170-172 are formed by a combination of a recess and a projection and the sealing material 130 interposed between the recess and the projection. Alternatively, the seals 170-172 can be formed by flat surfaces and the sealing material 130 interposed between the flat surfaces.

In the embodiment, the casing seal 170 overlaps the connector bottom seal 172 (or, the connector top seal 171). Alternatively, the casing seal 170 may not overlap the connector bottom seal 172 (or, the connector top seal 171).

Such changes and modifications are to be understood as being within the scope of the present invention as defined by the appended claims.

What is claimed is:

1. An electronic control apparatus comprising:
   a substantially rectangular circuit board having first and second sides opposite to each other;
   a connector mounted on the first side of the circuit board, the connector including a connector housing and a plurality of connector terminals supported by the connector housing, the connector housing having a connector sealing part on its outer surface and including a mating portion adapted to be mated with an external connector, at least one of the plurality of connector terminals having a first end electrically connected to the circuit board and a second end adapted to be electrically connected to the external connector;

a casing body having an inner space for accommodating the circuit board and a connector opening for receiving the connector housing in such a manner that the mating portion of the connector housing is located outside the casing body, the casing body including a top casing that is located to face the first side of the circuit board and has a top sealing part on its edge portion, the casing body further including a bottom casing that is located to face the second side of the circuit board and has a bottom sealing part on its edge portion, the top and bottom casings being assembled into the casing body in such a manner that the top sealing part faces the bottom sealing part and a top portion of the connector sealing part, and that the bottom sealing part faces the top sealing part and a bottom portion of the connector sealing part; and a sealant including a first portion interposed between the top sealing part and the bottom sealing part to provide a casing seal, a second portion interposed between the top sealing part and the top portion of the connector sealing part to provide a connector top seal, and a third portion interposed between the bottom portion of the connector sealing part and the bottom sealing part to provide a connector bottom seal, wherein the casing seal, the connector top seal, and the connector bottom seal are joined together to cause the inner space of the casing body to be water-sealed, wherein the bottom sealing part has a substantially rectangular ring shape with four rounded corners, wherein the bottom portion of the connector sealing part faces two adjacent corners of the bottom sealing part and one side of the bottom sealing part, the one side directly connecting the two adjacent corners, wherein the bottom sealing part has a first recess and a second recess, and a third recess, the third recess connecting the first recess and the second recess to form the rectangular ring shape, wherein the top sealing part has a first projection inserted in the first recess to provide the casing seal, wherein the bottom portion of the connector sealing part has a second projection inserted in the second recess to provide the connector bottom seal, wherein the third recess is wider than the first recess and the second recess, wherein the casing seal, the connector top seal, and the connector bottom seal are joined together in the third recess, and wherein at least one of the first projection and the second projection is inserted in the sealant in the third recess.

2. The electronic control apparatus according to claim 1, wherein
the bottom portion of the connector sealing part is located closer to the mating portion of the connector housing than the top portion of the connector sealing part in the mating direction, and wherein
the casing seal, the connector top seal, and the connector bottom seal are joined together to provide a three-way joint at each longitudinal end of the connector housing.

3. The electronic control apparatus according to claim 2, wherein
the connector top seal extends substantially straightly in the longitudinal direction of the connector housing, and wherein
the casing seal, the connector top seal, and the connector bottom seal are joined together to provide a T-shaped joint at each longitudinal end of the connector housing.

4. The electronic control apparatus according to claim 1, wherein
a distance between the circuit board and the mating portion of the connector is equal to or less than a distance between the connector top seal and the mating portion of the connector in the mating direction.

5. The electronic control apparatus according to claim 2, wherein
the joint is located at each end of the bottom portion of the connector sealing part.

6. The electronic control apparatus according to claim 2, wherein
the bottom portion of the connector sealing part extends beyond the joint, and the connector bottom seal and the casing seal are partially arranged side by side over a predetermined length to overlap each other in the longitudinal direction of the connector housing.

7. The electronic control apparatus according to claim 1, wherein
the top sealing part has a third projection and wherein
the top portion of the connector sealing part has a fourth recess for receiving the third projection to provide the connector top seal.

8. The electronic control apparatus according to claim 7, wherein each projection has a rounded tip.

9. The electronic control apparatus according to claim 1, wherein
both the first projection and the second projection are inserted in the third recess to press the sealant in the third recess.

10. The electronic control apparatus according to claim 9, wherein
the third recess includes first and second depth portions having different depths, wherein
the first projection is inserted in the first depth portion, and wherein
the second projection is inserted in the second depth portion.

11. The electronic control apparatus according to claim 10, wherein
the first depth portion is deeper than the second depth portion.

* * * * *